(12) United States Patent
Fiumara

(10) Patent No.: US 9,553,209 B2
(45) Date of Patent: Jan. 24, 2017

(54) PROCESS FOR MANUFACTURING A SEMICONDUCTOR DEVICE COMPRISING AN EMPTY TRENCH STRUCTURE AND SEMICONDUCTOR DEVICE MANUFACTURED THEREBY

(71) Applicant: STMICROELECTRONICS S.R.L., Agrate Brianza (IT)

(72) Inventor: Antonino Fiumara, Messina (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 14/856,148

(22) Filed: Sep. 16, 2015

(65) Prior Publication Data

US 2016/0141428 A1    May 19, 2016

(30) Foreign Application Priority Data

Nov. 18, 2014   (IT) .............. TO2014A0955

(51) Int. Cl.

| H01L 21/00 | (2006.01) |
| H01L 29/06 | (2006.01) |
| H01L 29/861 | (2006.01) |
| H01J 9/02 | (2006.01) |
| H01J 21/10 | (2006.01) |
| H01J 19/24 | (2006.01) |
| H01J 21/04 | (2006.01) |
| H01L 21/3065 | (2006.01) |
| H01L 21/308 | (2006.01) |
| H01L 29/66 | (2006.01) |

(52) U.S. Cl.
CPC ............. *H01L 29/861* (2013.01); *H01J 9/025* (2013.01); *H01J 19/24* (2013.01); *H01J 21/04* (2013.01); *H01J 21/105* (2013.01); *H01L 21/3065* (2013.01); *H01L 21/3081* (2013.01); *H01L 29/6609* (2013.01)

(58) Field of Classification Search
CPC .... H01L 29/861; H01L 29/66; H01L 21/3065; H01L 21/308; H01J 19/24; H01J 21/00; H01J 29/02; H01J 21/10
USPC ..... 438/20, 8, 9, 48, 22, 42; 257/10, 11, 77, 257/329
See application file for complete search history.

(56) References Cited

U.S. PATENT DOCUMENTS

| 5,569,973 A | 10/1996 | Zimmerman | |
| 6,083,069 A * | 7/2000 | Lu .................... | G11C 16/0416 257/E29.302 |
| 6,184,121 B1 * | 2/2001 | Buchwalter ......... | H01L 21/7682 257/522 |
| 2001/0010649 A1 | 8/2001 | Lu | |
| 2014/0353576 A1 | 12/2014 | Patti | |

(Continued)

FOREIGN PATENT DOCUMENTS

| CN | 203932001 U | 11/2014 |
| JP | 4-67535 A | 3/1992 |

*Primary Examiner* — Thinh T Nguyen
(74) *Attorney, Agent, or Firm* — Seed Intellectual Property Law Group LLP

(57) ABSTRACT

The process is based upon the steps of: forming a trench in a body including a substrate and at least one insulating layer; and depositing a metal layer above the body for closing the open end or mouth of the trench. The trench is formed by selectively etching the body, wherein the reaction by-products deposit on the walls of the trench and form a passivation layer along the walls of the trench and a restriction element in proximity of the mouth of the trench.

20 Claims, 3 Drawing Sheets

(56) References Cited

U.S. PATENT DOCUMENTS

2015/0348977 A1\* 12/2015 Barth, Jr. ............ H01L 27/1203
257/302

\* cited by examiner

Known Art

PROCESS FOR MANUFACTURING A SEMICONDUCTOR DEVICE COMPRISING AN EMPTY TRENCH STRUCTURE AND SEMICONDUCTOR DEVICE MANUFACTURED THEREBY

BACKGROUND

Technical Field

The present disclosure relates to a process for manufacturing a semiconductor device comprising an empty trench structure, and a semiconductor device obtained with said process.

Description of the Related Art

In the present context, the term "empty trench" refers to the fact that the trench (or some other cavity of any shape) is not filled, irrespective of the conditions of pressure existing inside the trench itself.

In semiconductors devices it is at times required to provide an empty trench. For example, empty-channel transistor devices are under study (also called "microminiature vacuum tubes" or "vacuum microelectronic devices"—VMDs) present in which is a very deep trench closed at the top by a layer of metal, for example aluminum, which operates as ion-emitter element.

An example of an embodiment of an empty trench microelectronic device and its manufacturing method are described, for example, in U.S. Patent Publication No. 2014/0353576 in the name of the present applicant, as described hereinafter.

With reference to FIG. 1, an empty trench device 1 comprises a substrate 2 of heavily doped semiconductor material, such as silicon, a stack 3 of layers 4-6, which extends above the substrate 1, a trench or hole 10, which extends throughout the thickness of the stack 3, as far as the substrate 1, and a cathode metal region 11, which extends above the stack 3 and closes the trench 10 at the top. The trench 10 is here in a condition of negative pressure, and is thus defined as "vacuum hole".

The stack 3 of layers here comprises a first insulating layer 4 on the substrate 2, a semiconductor layer 5, made, for example, of polycrystalline silicon, and a second insulating layer 6, on the semiconductor layer 5.

A contact structure 12 is formed above the cathode metal region 11, and an anode metal layer 13 extends underneath the substrate 2.

A passivation layer 15, of silicon nitride, coats the side walls of the trench 10.

The device 1 is obtained as follows: the layers 4-6 are deposited in sequence on the substrate 2; then, using a resist mask, the layers 4-6 are chemically etched in sequence in different apparatuses and using appropriate etching solutions. Next, the passivation layer 15 is deposited, in a highly conformable way, and is then removed from the bottom of the trench 10 and from the external part of the trench 10, above the second insulating layer 6. Then a metal layer, made for example of aluminum, that closes the trench 10 at the top and forms the cathode metal region 11 is deposited in a non-conformable way and shaped lithographically.

In the practical manufacture of the device, there have been noted difficulties in deposition of the metal layer that is to form the cathode metal region 11. In fact, even using non-conformable material and deposition techniques, it is not always possible to guarantee that the metal does not penetrate extensively within the trench 10. Furthermore, the presence of metal particles inside the trench is disadvantageous given that any possible metal traces in the trench 10 may give rise to leakage that cannot be easily distinguished from emissions of the cathode metal region, resulting in an improper operation of the device.

It is thus desirable for the metal layer (which constitutes the cathode region) to extend above the trench and not penetrate therein.

This requirement, also in common with other empty trench semiconductor products, is not easy to meet, given the absence of a stop structure, also taking into account the conditions of negative pressure present in certain applications.

BRIEF SUMMARY

One or more embodiments of the present provides a process and a device that may overcome one or more of the drawbacks of the known art.

According to the present disclosure, a process for manufacturing a semiconductor device comprising an empty trench structure, and a semiconductor device obtained with said process are provided, as defined in claims 1 and 12, respectively.

In one embodiment, in order to prevent penetration of metal material into the trench, during at least part of etching thereof, the products of reaction of a polymeric type, instead of being removed with the subsequent processes of resist removal, are left, as deposited, on the walls of the trench. In this way, on these, a passivation layer is formed, which, in the proximity of the open end or mouth of the trench, forms a sort of narrowing that restricts the area of the mouth itself. By modulating appropriately the etching conditions, said narrowing forms a "collar" element that prevents penetration of the metal material, for example aluminum, into the trench during the subsequent step of deposition of the cathode layer. In addition, the collar forms a sort of "mold", which gives rise to a tip shape of the cathode region, which optimizes the performance of the finished device.

BRIEF DESCRIPTION OF THE SEVERAL VIEWS OF THE DRAWINGS

For a better understanding of the present disclosure, a preferred embodiment thereof is now described, purely by way of non-limiting example, with reference to the attached drawings, wherein.

DETAILED DESCRIPTION

Figure 1:
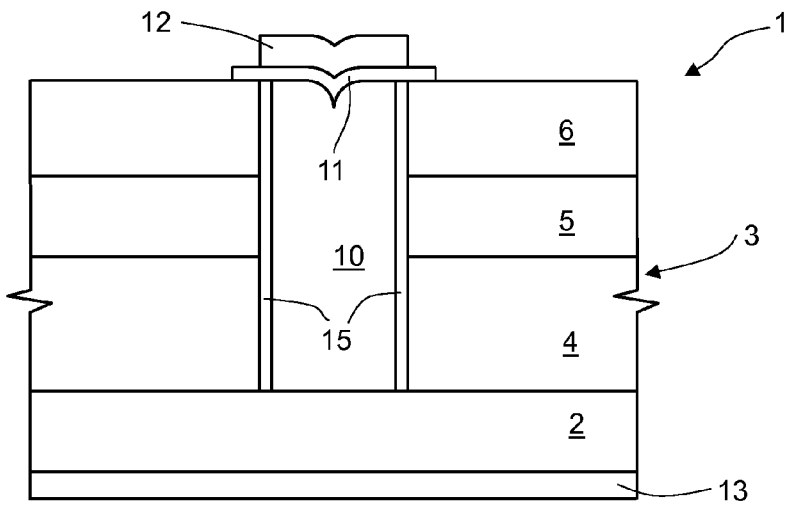
FIG. 1 is a cross-section through a vacuum microelectronic device (VMD)
Figure 2:
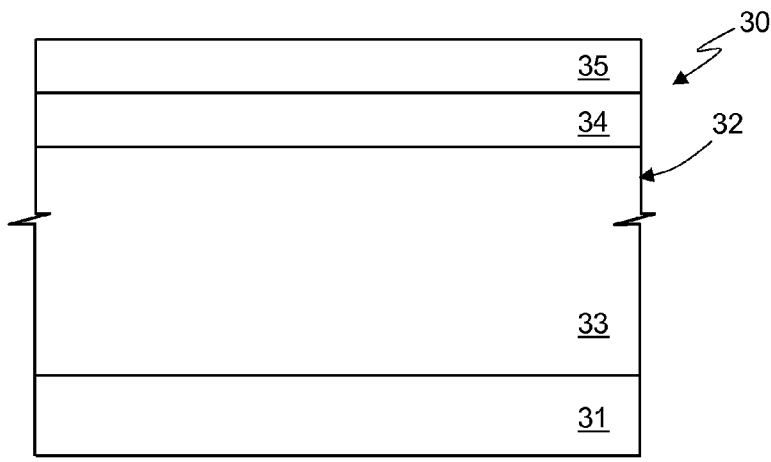
FIGS. 2-6 show cross-sections through a wafer of semiconductor material in successive steps of manufacturing of a vacuum microelectronic device, according to one embodiment of the present process.

An embodiment of the present process for manufacturing the above device is described hereinafter, with reference to FIGS. 2-7.

In particular, the process described regards manufacture of an empty trench microelectronic semiconductor device, such as a diode, a triode, a tetrode, a pentode or some other device having a similar basic structure.

Initially (FIG. 2), on a substrate 31, of heavily doped semiconductor material, such as monocrystalline silicon, a stack 32 of layers is formed. The ensemble constituted by the substrate 31 and the stack 32 forms a body 30, for example a wafer.

The substrate 31 is typically of an N type, for example doped with phosphorus, and has a resistivity of approximately 4 mΩ·cm.

The stack 32 here comprises a first insulating layer 33, a conductive layer 34, and a second insulating layer 35.

For example, the first insulating layer 33 is made of tetraethylorthosilicate (TEOS) formed by chemical vapor deposition (CVD) with a thickness of, for example, approximately 1 µm.

The conductive layer 34 is, for example, made of semiconductor material such as polycrystalline silicon of an N type, doped with phosphorus and having a thickness of approximately 0.5 µm. The conductive layer 34 is, for example, deposited via low-temperature chemical vapor deposition (LTCVD) and may have a resistivity comprised between 10 and 100 mΩ·cm. The conductive layer 34 is generally defined after it has been deposited for forming a control grid, in a way not shown.

The second insulating layer 35 is, for example, made of TEOS, which is also deposited via CVD and may have a thickness of approximately 0.5 µm, in such a way that the stack 32 has an overall thickness of approximately 2 µm.

Figure 3:
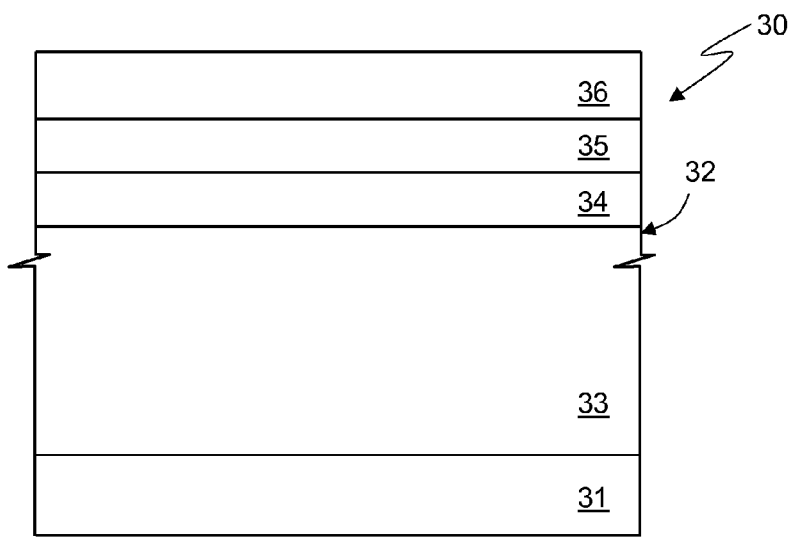

As shown in FIG. 3, on the stack 32 a masking layer 36 is laid, of a thickness of approximately 0.5 µm. For example, the masking layer 36 is made of AlSiCu.

Figure 4:
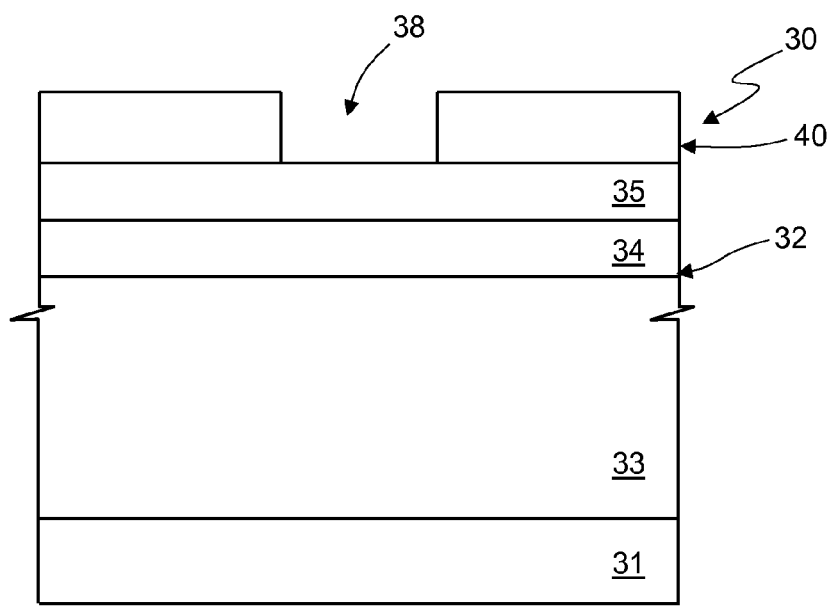

As shown in FIG. 4, the masking layer 36 is shaped photolithographically, for forming a hard mask 40, of metal material, having an opening 38 of a shape and width corresponding to the ones desired for the trench to be obtained. For example, the trench 41 may have a circular shape having a width of approximately 0.6 µm.

Using the hard mask 40, a trench etch is carried out, with selective removal of the stack 32. In particular, a reactive ion etch (RIE) is carried out, of a type generally used for dry etching of oxides. In particular, here, the trench etch uses an etching chemistry rich in $CF_4$ and with low selectivity in regard to silicon, which is the same for all the layers 33-35 of the stack 32. According to one embodiment, initially etching of the second insulating layer 35 and of the conductive layer 34 is carried out, then a washing treatment in amine solvent is performed, using spray equipment, and finally etching of the first insulating layer 33 is carried out, using the same etching solution as previously and the same machine.

For example, for the etch, the machine MXP+ manufactured by Applied Materials, Inc., may be used at a low pressure (for example, comprised between $10^{-2}$ and 1 Torr, in particular approximately 0.2 Torr), with application of a magnetic field of 10 Gauss and using a gas of $CF_4$, Ar, $CHF_3$, and $O_2$. According to an embodiment of the present process, for the etching step, a flow of $CF_4$ is used that is greater than, for example three times, that of $CHF_3$. In particular, the flow of $CF_4$ may be comprised between 40 and 50 sccm, and the flow of $CHF_3$ may be comprised between 10 and 20 sccm. During the plasma-etching reaction, as is known, polymeric by-products are produced, with a base of C and F, the majority of which is generally expelled and removed the structures being defined, by an appropriate choice of the pressure and of the flow of the etching gases.

In the process described, instead, the parameters are studied so that said by-products, during the expulsion process, deposit with a particular pattern on the walls of the structure just defined. In fact, with the values of flow indicated, as the trench 41 is formed, on the walls of this residue deposits, thus forming a passivation layer 42.

According to one embodiment, the etching step is divided into two parts. Initially, an etch of the second insulating layer 35 and of the conductive layer 34 is carried out, also referred to hereinafter as "pre-etch". Then a washing treatment in amine solvent is carried out, using spray equipment, and finally the first insulating layer 33 is etched, using the same previous etching solution and the same machine, in particular the solution and the machine indicated above.

Consequently, in this case, the by-products accumulating on the walls during the first etching step are removed by washing, and the passivation layer 42 is only formed during the second etching step, after washing. Other etching/washing steps or a single etch are, however, possible, as will be clear to a person skilled in the art, on the basis of the desired geometries, the used machines, and possibly on the basis of trials. In case of multiple etches, use of the same etching conditions in the various steps simplifies the operations and reduces the manufacturing costs.

Figure 5:
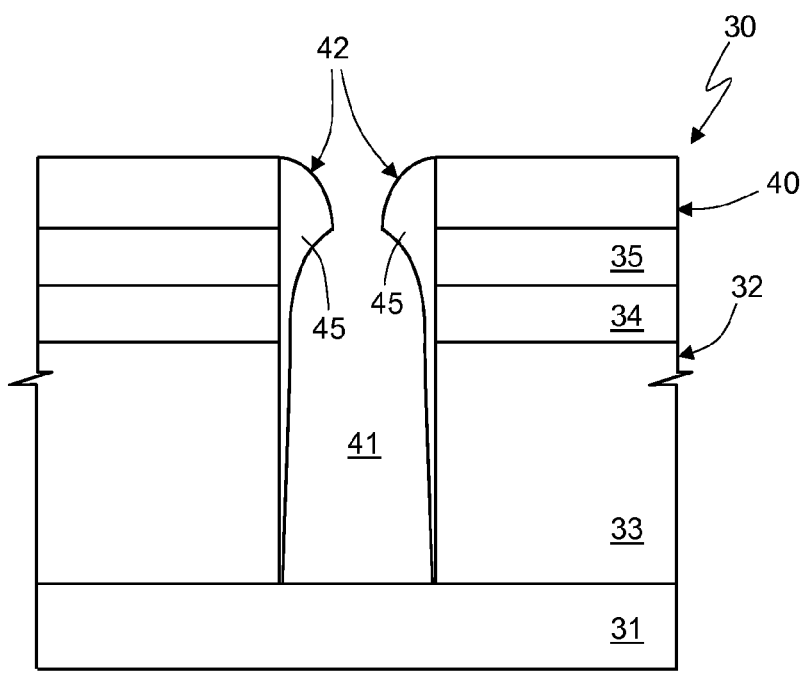

As shown in FIG. 5, the passivation layer 42 that forms does not have a uniform thickness, but thickens in proximity of an open end or the mouth of the trench 41, where it forms a sort of restriction or collar element 45 having a profile that is bulging or approximately shaped as a toroid quarter in the top part, facing the outside of the trench 41. For example, in tests carried out by the present applicant, the passivation layer 42 has a thickness ranging between 0.05 µm and 0.2 µm, and the collar element 45 has a thickness of approximately 0.25 µm.

Etching is carried out for a fixed time, for example 200 s, removing the entire thickness of the stack 32, with a possible minor etching of the substrate 31 (not shown).

Performing an etch using just a chemistry, with the hard mask 40 of metal material, enables the profile of the trench 41 to be particularly smooth and uniform, without significant steps at the interface between the layers 33-35, thus facilitating formation of the passivation layer 42 and coating, by the latter, of the wall of the trench 41, in particular in the area of the conductive layer 34.

Figure 6:
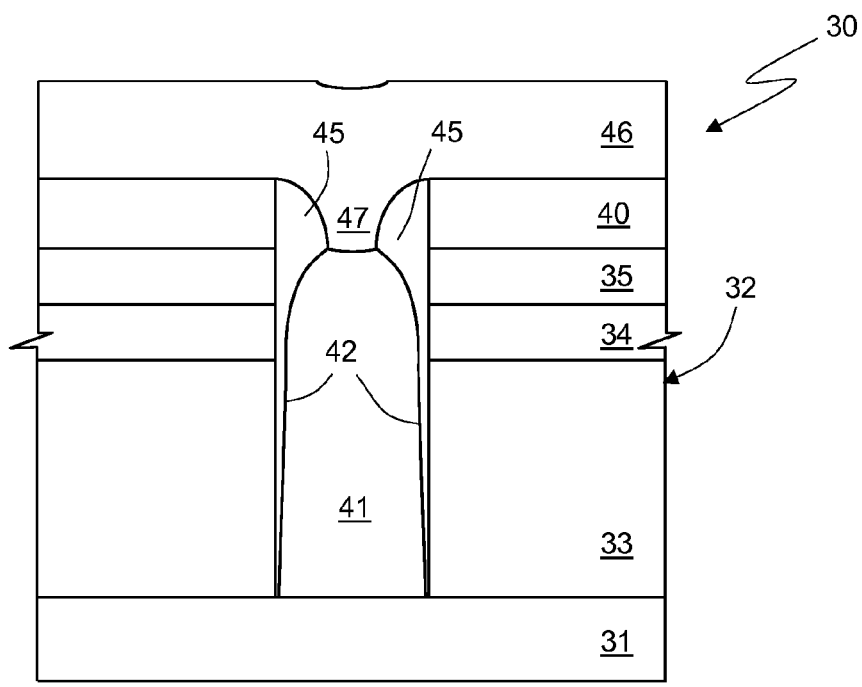

As shown in FIG. 6, a cathode layer 46 is deposited. For example, an aluminum layer with a thickness of approximately 3 µm is laid with a non-uniform deposition technique, typically sputtering at a low temperature, less than 300° C. By virtue of the shape of the collar 45, the cathode layer 46 cannot penetrate into the trench 41 and has a tip-shaped or cusp-shaped portion 47 in proximity of the mouth of the trench 41.

When it is desired to form a device wherein the trench is in a negative pressure or vacuum condition, deposition of the cathode layer 46 may be carried out in a high-vacuum environment, for example between $10^{-7}$ and $10^{-8}$ Torr.

Figure 7:
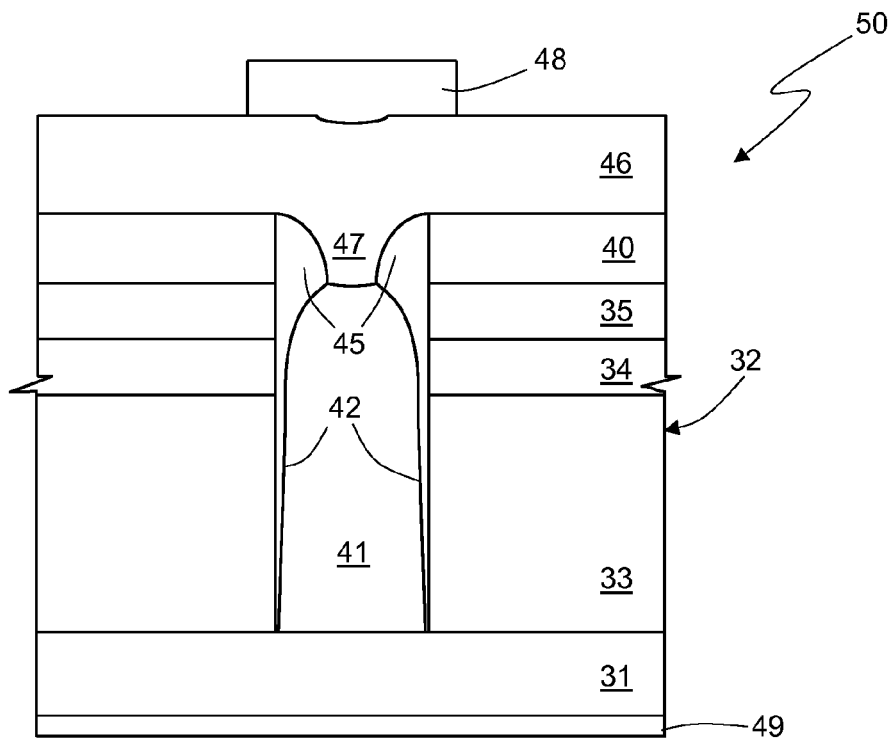
FIG. 7 is a cross-sectional view through an embodiment of the present microelectronic device.

Finally as shown in FIG. 7, the cathode layer 46 is defined, in a not shown manner. In a known way, a cathode contact 48 (and possibly grid contacts, not shown, for contacting the conductive layer 34) is formed above the cathode layer 46, and an anode contact 49 is formed under the substrate 49. An empty trench device 50 is thus obtained. Then, the usual passivation steps follow.

The described process and the finished device thereby obtained have numerous advantages.

In fact, due to the presence of the restriction element or collar 45, the trench device 50 does not have any metal intrusions inside the trench 41. Moreover, the cathode layer 46 has a tip-shaped portion 47 having an optimal shape for emission of charges during operation of the device.

The wall of the trench 41 is particularly uniform and without steps, ensuring passivation of the conductive layer 34 and thus electrical insulation thereof, which is necessary for proper operation of the device as integrated microminiature vacuum tube.

Finally, it is clear that modifications and variations may be made to the process and the device described and illustrated herein, without thereby departing from the scope of the present disclosure.

For instance, even though the described example refers to formation of a trench in a stack of layers, the same approach can be adopted for forming openings and cavities in even single layers.

Moreover the trench may have any shape.

As indicated, the number of etching steps may vary according to the specific conditions. In case of successive etches followed by washing, the etching steps may be carried out with different parameters. In particular, in the first etching step or steps, the parameters may be standard, with automatic removal of the by-products, if so desired.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A process for manufacturing a microelectronic semiconductor device, the process comprising:
    selectively etching a body to form a trench having side walls and an open end, the selectively etching forming reaction by-products;
    causing the reaction by-products to deposit on the side walls of the trench to form a restriction element in proximity of the open end of the trench; and
    forming a metal layer above the body, the metal layer closing the open end of the trench without penetrating into the trench.

2. The process according to claim 1, wherein causing the reaction by-products to deposit on walls of the trench comprises forming a passivation layer on the side walls of the trench, the passivation layer forming the restriction element in proximity of the open end of the trench.

3. The process according to claim 1, wherein selectively etching comprises carrying out a dry RIE with flows of gas comprising $CF_4$ and $CHF_3$, wherein the flow of $CF_4$ is greater than the flow of $CHF_3$.

4. The process according to claim 3, wherein the flow of $CF_4$ is 2 to 4 times the flow of $CHF_3$.

5. The process according to claim 3, wherein selectively etching comprises using a magnetic-confinement etching machine.

6. The process according to claim 1, wherein selectively etching the body to form the trench comprises forming a mask of metal material covering the body and having an opening and selectively removing the body through the opening of the mask.

7. The process according to claim 6, wherein the metal layer is deposited above the mask and forms a tip-shaped portion within the opening.

8. The process according to claim 1, wherein the body comprises a substrate of semiconductor material and at least one insulating layer above the substrate, and selectively etching comprises removing portions of the insulating layer.

9. The process according to claim 1, wherein the body comprises a substrate of semiconductor material and a stack of layers overlying the substrate, and selectively etching the body comprises selectively etching the stack of layers using an etching solution.

10. The process according to claim 1, wherein forming the metal layer is carried out in vacuum conditions to obtain an integrated microminiature vacuum-tube device.

11. The process according to claim 1, wherein selectively etching comprises a pre-etching and a washing step.

12. A vacuum microelectronic device comprising:
    a semiconductor body;
    a trench etched in the semiconductor body, the trench having side walls and an open end;
    a restriction element at an open end of the trench, the restriction element formed by reaction by-products, at least some of the reaction by-products being formed on the side walls of the trench; and
    a metal layer above the semiconductor body, the metal layer closing the open end of the trench without penetrating into the trench.

13. The vacuum microelectronic device according to claim 12, further comprising at least one insulating layer over the semiconductor body, the insulating layer having a through opening aligned with the trench, the restriction element being in the through opening.

14. The vacuum microelectronic device according to claim 12, wherein the restriction element has a first thickness at the open end of the trench, the restriction element being on the sidewalls of the trench and having a second thickness that is less than the first thickness.

15. The vacuum microelectronic device according to claim 12, wherein the restriction element is a passivation layer.

16. The vacuum microelectronic device according to claim 12, wherein the metal layer is a cathode layer.

17. A process comprising:
    forming a mask layer over a stack of layers, the mask layer including at least one through opening having side walls;
    etching the stack of layers through the at least one through opening of the mask layer to form a trench, the trench having side walls and an open end, wherein etching causes reaction by-products to be deposited on the side walls of the trench and the side walls of the mask layer to form a restriction element; and
    forming a metal layer covering mask layer and the stack of layers, the metal layer closing the open end of the trench without penetrating into the trench.

18. The process according to claim 17, wherein the metal layer penetrates into the at least one through opening of the mask layer.

19. The process according to claim 17, wherein selectively etching comprises plasma-etching.

20. The process according to claim 17, wherein forming the metal layer is carried out in a vacuum to obtain an integrated microminiature vacuum-tube device.

* * * * *